(12) United States Patent
Papachristos et al.

(10) Patent No.: US 9,180,599 B2
(45) Date of Patent: Nov. 10, 2015

(54) METHOD OF DEPOSITION OF A LAYER ON A RAZOR BLADE EDGE AND RAZOR BLADE

(75) Inventors: Vassilis Papachristos, Athens (GR); Michalis Karoussis, Athens (GR); Dimitris Pissimissis, Athens (GR)

(73) Assignee: BIC-VIOLEX S.A., Anixi, Attiki (GR)

( * ) Notice: Subject to any disclaimer, the term of this patent is extended or adjusted under 35 U.S.C. 154(b) by 790 days.

(21) Appl. No.: 11/574,964

(22) PCT Filed: Sep. 8, 2004

(86) PCT No.: PCT/EP2004/010770
§ 371 (c)(1),
(2), (4) Date: Mar. 8, 2007

(87) PCT Pub. No.: WO2006/027016
PCT Pub. Date: Mar. 16, 2006

(65) Prior Publication Data
US 2008/0190758 A1    Aug. 14, 2008

(51) Int. Cl.
C23C 14/00 (2006.01)
B26B 21/60 (2006.01)
C23C 14/02 (2006.01)
C23C 14/06 (2006.01)
C23C 14/35 (2006.01)
C23C 14/56 (2006.01)

(52) U.S. Cl.
CPC .............. B26B 21/60 (2013.01); C23C 14/025 (2013.01); C23C 14/0635 (2013.01); C23C 14/352 (2013.01); C23C 14/568 (2013.01)

(58) Field of Classification Search
CPC ... C23C 14/0635; B23P 15/403; Y10S 76/08; B23B 21/125; B23B 21/565; B23B 5/006; B23B 21/60
USPC .......................................... 204/192.1, 192.32
See application file for complete search history.

(56) References Cited

U.S. PATENT DOCUMENTS

| 3,480,483 | A |   | 11/1969 | Wilkinson |
| 3,562,140 | A | * | 2/1971 | Skinner .................... 204/298.27 |
| 3,635,811 | A |   | 1/1972 | Lane |
| 3,652,443 | A |   | 3/1972 | Fish et al. |
| 3,682,795 | A |   | 8/1972 | Fischbein et al. |
| 3,740,327 | A |   | 6/1973 | Lane et al. |
| 3,743,551 | A |   | 7/1973 | Sanderson |

(Continued)

FOREIGN PATENT DOCUMENTS

| DE | 286479 A * | 1/1991 |
| EP | 589641 A2 * | 3/1994 |

(Continued)

OTHER PUBLICATIONS

Derwent Abstract 1991-185738 published Jan. 1991 to Erler (DD286479).*

(Continued)

*Primary Examiner* — John Brayton
(74) *Attorney, Agent, or Firm* — Jones Day

(57) ABSTRACT

A method for deposition of a layer on a razor blade edge of a razor blade, the layer including at least two components, in an enclosure comprising at least first and second sputter targets, each sputter target including at least one of the components to be deposited on the edge and being adapted, in operation, to release the component in the enclosure.

23 Claims, 2 Drawing Sheets

(56) References Cited

U.S. PATENT DOCUMENTS

| | | | |
|---|---|---|---|
| 3,754,329 A | 8/1973 | Lane | |
| 3,761,372 A | 9/1973 | Sastri | |
| 3,761,373 A | 9/1973 | Sastri | |
| 3,761,374 A | 9/1973 | Bromer et al. | |
| 3,774,703 A | 11/1973 | Sanderson | |
| 3,775,285 A | 11/1973 | Lane | |
| 3,784,458 A | 1/1974 | Lane | |
| 3,802,078 A | 4/1974 | Denes | |
| 3,811,189 A | 5/1974 | Sastri | |
| 3,829,969 A | 8/1974 | Fischbein et al. | |
| 3,835,537 A | 9/1974 | Sastri | |
| 3,838,512 A | 10/1974 | Sanderson | |
| 3,860,507 A * | 1/1975 | Vossen, Jr. | 204/192.12 |
| 3,894,337 A | 7/1975 | Jones | |
| 3,900,636 A | 8/1975 | Curry et al. | |
| 3,911,579 A | 10/1975 | Lane et al. | |
| 3,916,523 A | 11/1975 | Lane et al. | |
| 3,968,018 A | 7/1976 | Lanet et al. | |
| 4,468,437 A * | 8/1984 | Patten et al. | 428/553 |
| 4,470,895 A | 9/1984 | Coad et al. | |
| 4,486,285 A | 12/1984 | Aubert et al. | |
| 4,720,918 A | 1/1988 | Curry et al. | |
| 4,871,434 A | 10/1989 | Munz et al. | |
| 4,933,058 A | 6/1990 | Bache et al. | |
| 5,048,191 A | 9/1991 | Hahn | |
| 5,056,227 A | 10/1991 | Kramer | |
| 5,121,660 A | 6/1992 | Kramer | |
| 5,142,785 A * | 9/1992 | Grewal et al. | 30/32 |
| 5,497,550 A | 3/1996 | Trotta et al. | |
| 5,669,144 A | 9/1997 | Hahn et al. | |
| 5,799,549 A | 9/1998 | Decker et al. | |
| 5,940,975 A | 8/1999 | Decker et al. | |
| 5,972,168 A | 10/1999 | Egelhof et al. | |
| 6,289,593 B1 | 9/2001 | Decker et al. | |
| 6,423,419 B1 * | 7/2002 | Teer et al. | 428/469 |
| 6,589,400 B1 | 7/2003 | Schimion et al. | |
| 6,684,513 B1 | 2/2004 | Clipstone et al. | |
| 6,991,219 B2 * | 1/2006 | Aharonov et al. | 251/368 |
| 2002/0100420 A1 | 8/2002 | Burger et al. | |
| 2002/0182448 A1 * | 12/2002 | van der Kolk et al. | 428/698 |
| 2003/0035894 A1 | 2/2003 | Derflinger et al. | |
| 2003/0129407 A1 * | 7/2003 | Teer et al. | 428/408 |
| 2003/0155236 A1 * | 8/2003 | Kohara et al. | 204/298.18 |

FOREIGN PATENT DOCUMENTS

| | | |
|---|---|---|
| EP | 0 579 756 | 7/1998 |
| EP | 0 884 142 | 12/1998 |
| EP | 1 287 953 | 5/2003 |
| FR | 1600109 | 7/1970 |
| GB | 565 640 | 11/1944 |
| GB | 1221642 | 2/1971 |
| GB | 1 342 072 | 12/1973 |
| GB | 1350594 | 4/1974 |
| GB | 1416887 | 12/1975 |
| GB | 1465697 | 2/1977 |
| GB | 2 179 678 | 3/1987 |
| WO | WO 01/64406 | 9/2001 |
| WO | WO 2004/018166 | 3/2004 |
| WO | WO 2004/078428 | 9/2004 |
| WO | WO 2005/005110 | 1/2005 |

OTHER PUBLICATIONS

Translation to Erler (DD 286479) published Jan. 1991.*
Notice of Office Action—Korean Intellectual Property Office (KIPO), Jun. 28, 2011.
Office Action dated Dec. 7, 2010 issued by the Japanese Patent Office.

* cited by examiner

METHOD OF DEPOSITION OF A LAYER ON A RAZOR BLADE EDGE AND RAZOR BLADE

This application is a national stage application of PCT/EP2004/010770, filed on Sep. 8, 2004.

FIELD OF THE INVENTION

The embodiments of the present invention relate to a method for deposition of a layer on a razor blade edge, and a razor blade.

BACKGROUND OF THE INVENTION

Razor blades are generally made of a ceramic or steel substrate covered by a hard coating. An outer layer of an organic material is also often deposited on the hard coating, to reduce friction of the razor blade on the skin when shaving. This organic layer is often a PTFE material.

The hard coating usually primarily acts as a strengthening coating, in order to strengthen the blade and improve its life expectancy. Some particular materials providing a very good strength property, like for example chromium-platinum alloys, have been deposited in the past by placing the razor blade edges in front of a chromium-platinum alloy sputtering target and sputtering the target in order to deposit chromium-platinum on the razor blade edge. Yet, the proportions of chromium and platinum in the deposited coating are fixed by the proportions of chromium and platinum in the target.

SUMMARY OF THE INVENTION

It is an object of an embodiment of the present invention to provide a new method for the deposition on a razor blade of a hard layer comprising at least two components.

To this end, the embodiments of the present invention provide a method for deposition of a layer on a razor blade edge of a razor blade, the layer comprising at least two components, in an enclosure comprising at least a first and a second sputter targets, each the sputter target comprising at least one of the components to be deposited on the edge and being adapted, in operation, to release the component in the enclosure, the method comprising a step (a) wherein, under operation of both targets, the razor blade is moved relatively to the first and second targets to pass alternately in the vicinity of each target.

The method makes it possible to design coating layers with varying properties without having to manually replace the sputter targets and/or the blade edges during coating. Furthermore, the method enables the coating of many razor blade edges at a time.

In particular embodiments of the method according to the invention, one might also use the following features:
  the first and second sputter targets are operated by bombardment of noble gas ions;
  during step (a) a magnetic field is generated 20 by magnet devices in the vicinity of the targets;
  the magnet devices each include at least a central magnet disposed between two side magnets and with opposed polarity, the side magnets being stronger than the central magnet;
  the enclosure comprises first, second, third and fourth sputter targets, the first and third sputter targets facing each other and carrying the first component, the second and fourth sputter targets facing each other and carrying the second component, each of the first, second, third and fourth targets having a magnet device and the magnet devices of the second, third and fourth sputter targets being of same polarity;
  the first, second, third and fourth targets are fixed in the enclosure, and the razor blade is rotated relative to the enclosure, so that it passes successively in front of each of the first, second, third and fourth targets;
  the blade is rotated at a rotation speed over 4 rpm;
  the second component is a metal, the second and fourth targets are operated by a DC current with an intensity comprised between 0.5 and 20 A;
  the first element is carbon, the first and third targets comprise graphite, and the first and third targets are operated by a DC current with an intensity comprised between 0.5 and 20 A;
  the second component provides improved adherence to an organic material, and, during step (a), a ratio of the intensities applied on the first and second targets decreases;
  the metal is chromium;
  the blade edge is submitted to a DC voltage 20 comprised between 100 and 1000 V;
  the blade edge is submitted to a pulsed DC voltage;
  the layer has a given proportion of the components, each target is operated under given operation parameters, the method further including a step (e), prior to step (a), wherein the operation parameters are chosen in order to provide the proportion;
  prior to step (a), razor blades are stacked in a carousel;
  the method further comprises a sputter-etching step (b) wherein material is removed from the blade by simultaneously operating the second targets and applying a DC voltage on the blade;
  step (b) is performed before step (a);
  the method further comprises a step (c) wherein an additional layer comprising at least one of the components is deposited by operating only the targets comprising the components of the additional layer;
  step (c) is performed before step (a);
  step (a) is performed before step (c);
  the method further comprises a step (d) wherein an outer layer comprising an organic material is applied on the coating.

According to another aspect, the invention is related to a razor blade comprising a razor blade edge and a coating comprising:
  at least a metal-containing layer made of at least a first component consisting mainly of carbon, and a second component consisting mainly of a metal, and
  at least an outer layer of organic material in 20 contact with the metal-containing layer,
  wherein the metal exhibits improved adhesion properties with the organic material, and
  wherein, in the metal-containing layer, proportion of metal increases as the outer layer comes closer.

In various embodiments, one may use one and/or several of the following features:
  the metal is chromium;
  the coating comprises at least an additional 30 layer of at least one of the components;
  the blade is made of stainless steel.

BRIEF DESCRIPTION OF THE DRAWINGS

Other features and advantages of the embodiments of the present invention will be apparent from the following description, drawings and claims.

On the drawings.

On the drawings, corresponding or similar elements have the same reference numbers.

DETAILED DESCRIPTION

Figure 1:
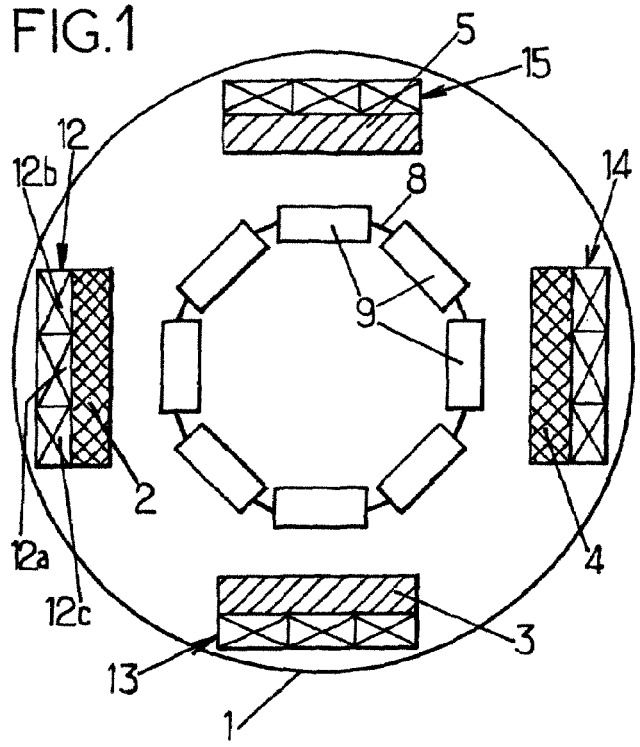
FIG. 1 is an horizontal sectional view of an apparatus adapted for implementing a method according to one particular embodiment of the invention.
Figure 2:
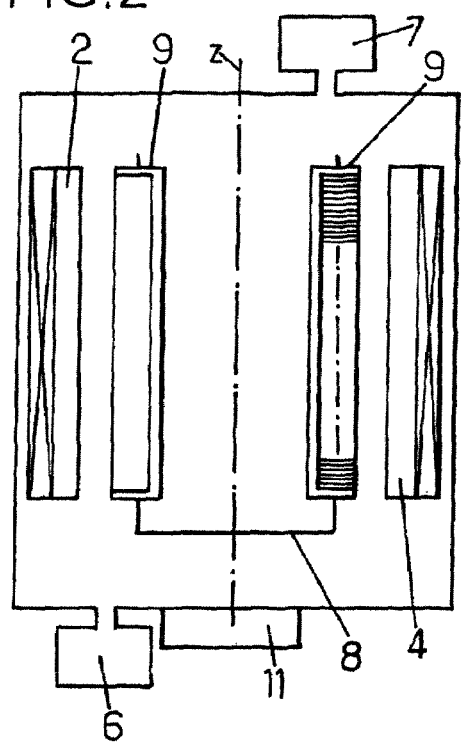
FIG. 2 is a vertical sectional view of the apparatus of FIG. 1.

FIG. 1 is a horizontal sectional view of a sputtering apparatus used for implementation of the method according to an embodiment of the present invention. The sputtering apparatus comprises an enclosure with an internal wall 1, for example cylindrical, wherein a low pressure atmosphere can be formed. The enclosure comprises sputter targets 2, 3, 4, 5 placed in a cross relationship, facing one another two by two. Any other suitable apparatus, such as for example an in-line sputtering apparatus with at least two sputter targets, could be used for implementation of the method according to an embodiment of the present invention.

First and third sputter targets 2 and 4, facing one another, mainly comprise a first component to be deposited on razor blade edges. For example, first and third sputter targets 2 and 4 comprise a material providing good hardness and strength properties. First and third sputter targets comprise for example carbon in the form of graphite.

Second and fourth sputter targets 3 and 5, facing one another, mainly comprise a second component to be deposited on razor blade edges. For example, second and fourth sputter targets 3 and 5 comprise a material providing good adhesion of first component on the razor blade edge or/and on organic material. Second and fourth sputter targets comprise for example a metal, for example, chromium, niobium or tungsten.

The first, second, third and fourth targets could be elemental targets, or compound targets containing a compound of at least two elements to be deposited on the blade edge.

Each sputter target 2, 3, 4, 5 is attached on a magnetron 12, 13, 14, 15, respectively, located between the target and the wall 1. The magnetron can be operated to enhance the deposition speed of components to be deposited on the razor blade edges.

In an embodiment, a given polarity is chosen for three of the magnetrons, and the opposite polarity for a fourth magnetron.

The magnetrons can for example be unbalanced magnetrons, of the type comprising three magnets, a central magnet 12a being surrounded by two stronger side magnets 12b and 12c with opposite polarity, as will be apparent from FIG. 1. Magnetrons 13, 14 and 15 also are unbalanced magnetrons.

In a way similar to the above description, the central magnets of three of the four magnetrons have a given polarity while the central magnet of the other magnetron has the opposite polarity. For example, polarity of central magnets 12a, 15a and 14a is chosen South, while polarity of central magnet 13a is chosen North. Of course, polarity of the side magnets is chosen accordingly.

The targets can be operated by application of a DC current on the targets, provided by a DC power supply (not shown) connected to the targets. Each target can be connected alternatively or simultaneously with the DC power supply.

The apparatus comprises a vacuum pump 6 which can be operated to provide a certain degree of vacuum in the enclosure.

The apparatus also comprises a source of argon atoms 7 which is adapted to release a given pressure of argon in the enclosure. Other noble gases could be used.

In the apparatus a rotating carousel 8 can be disposed, which is adapted to move, for example to rotate around a vertical axis (z). The carousel is part of the apparatus, or can be removably maintained inside the apparatus for the deposition process. The carousel holds bayonets (8 bayonets, as exemplified on FIG. 1) which hold stacked razor blades to be coated, of the type used in mechanical razors. Many razor blade edges can thus be coated during the same deposition process.

The carousel is connected to a DC power supply 11 able to provide a DC voltage bias on the razor blades.

Figure 4:
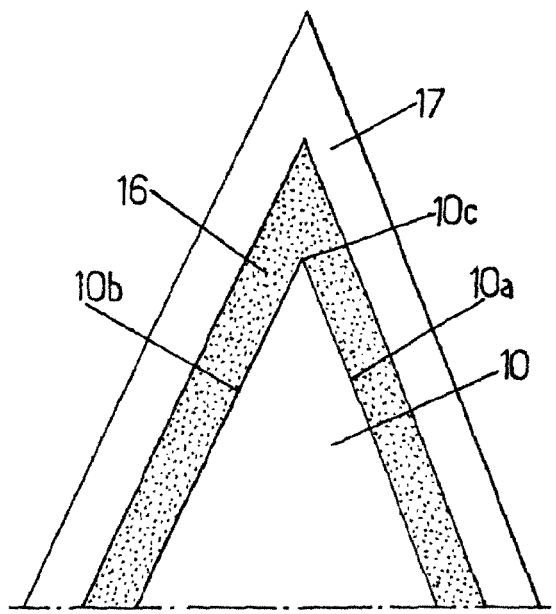
FIG. 4 is a section of a razor blade according to one embodiment of the invention.
Figure 5:
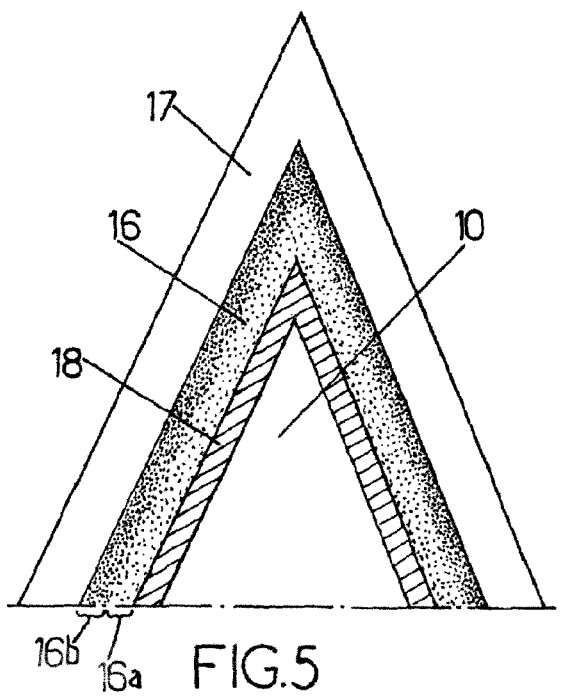
FIG. 5 is a section of a razor blade according to another embodiment of the invention.

The razor blades 10 are for example made of an electrically conducting material, for example stainless steel, and can have been preliminarily submitted to grinding operations that provide a sharpened edge 10 of two sides 10a, 10b that converge towards tip 10c (see for example FIGS. 4 and 5). The razor blades are loaded in the bayonets so that, in the apparatus, the tip 10c is directed towards the enclosure wall (and the targets).

Figure 3:
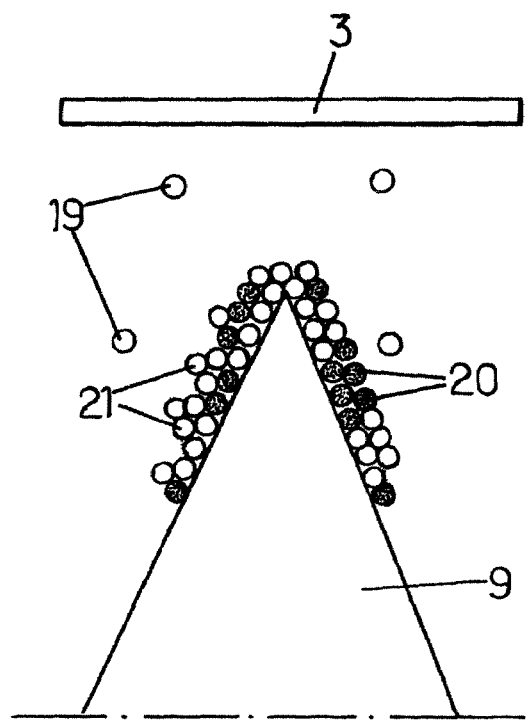
FIG. 3 is a schematic representation of a 10 blade during the coating process.

According to the principles of sputter-deposition, as shown on FIG. 3, when a sputter target (for example chromium target 3) is operated, argon ions bombard the target to release in the enclosure atoms and ions 19 of the component of the target. The target atoms travel towards the blade because of the velocity they acquired due to transfer of momentum from argon ions (ballistic component of the flux) and because of concentration gradients (diffusive component of the flux). The target ions are also attracted to the razor blade by the applied bias. They deposit on the blade edge 9 where graphite atoms 20 (black dots on FIG. 3) and other chromium atoms 21 (white dots on FIG. 3) have already deposited when the razor blade previously passed in the vicinity of a carbon target (for example carbon target 2 on FIG. 1) and a chromium target (for example chromium target 5 on FIG. 1) respectively.

Once the razor blade edges have been loaded in the enclosure, it is closed, and the enclosure is evacuated by pump 6 to reach a base pressure of about $10^{-5}$ Torr.

A preliminary sputter-etching step can be performed in order to clean and/or remove some materials from the tip 10c and sides 10a, 10b of the razor blades.

A preliminary sputter deposition step of an interlayer of at least one of the two components (for example chromium) can be performed. The internal pressure is set to $3.10^{-3}$ Torr. Second sputter targets 3 and 5 are operated by a DC current of 1.5 A, and a 300 V DC voltage is applied to the razor blades while the carousel is rotating at about 5.5 rpm. The enclosure wall and targets 2 and 4 are grounded.

The operating parameters, and simultaneous fast rotation speed (in general between 4 and 40 rpm) enable equal sputter deposition on all razor blade edges.

By switching off the DC current applied on the second sputter targets, and by providing a DC current on the first sputter targets 2, 4, and continuing the application of the DC voltage on the razor blades and the rotation, one can provide, on the interlayer of the second component, a second layer of the first component (for example carbon).

It is thus possible to coat a very large number of razor blade edges with two homogeneous layers each including one component, with very few handling operations.

The apparatus can also be used in order to deposit a homogeneous layer comprising both components in a given proportion. The operating parameters are chosen in order to provide the proportion. This coating can be applied directly on the razor blade or on an interlayer of one of the components as described hereinabove.

After deposition of the interlayer, the carousel still rotating at the speed of 5.5 rpm, chromium-containing sputter targets 3, 5 are operated by a DC current between 0.5 and 20 A. Carbon-containing sputter targets 2, 4 are operated by a DC current between 0.5 and 20 A. A negative DC voltage of about 100 to 2000 V is applied on the blades.

The ratio of the intensities applied on each target is chosen in order to provide with a given proportion of the components in the homogeneous coating. The method thus enables, during production, to easily adapt the coating properties to various customer requirements. For example, more corrosion resistance properties could be needed in some countries, and the process parameters could be easily adapted to increase the amount of corrosion resistant material for razor blades manufactured for these countries.

During the end of the deposition of the homogeneous layer, the ratio of the concentrations of both components can be varied by changing the ratio of the intensities applied on the various targets. If one of the components provides good adhesion to outer organic coatings such as PTFE, for example chromium, its relative concentration can be increased in order to improve adhesion of the PTFE coating.

It is also possible to provide with a top layer comprising only one of the two components, for example chromium. Pressure in the enclosure is $3.10^{-3}$ Torr. The chromium sputter targets 3 and 5 are operated by a DC current of 1.5 A. DC voltage of 100-1000 V is applied on the blades. The carbon targets 2 and 4 are grounded. The carousel still rotates at about 5.5 rpm.

A top layer of chromium is used to provide good adhesion to outer organic coatings such as PTFE which is usually deposited on the razor blade after deposition of the hard coating.

After deposition, the coated razor blade can be sputter-etched. After setting argon gas pressure and DC voltage on the blades, chromium sputter targets are operated while carbon sputter targets are grounded.

That way, material is removed from the topmost coating layer in order to re-sharpen the blade.

Finally, a fluorinated polymer final coating is applied on the sputter-deposited film at the cutting edge of the blade. Application of the polymer can be made by a spraying method followed by sintering.

Examples of razor blades according to embodiments of the present invention can be seen on FIGS. 4 and 5.

On FIG. 4, a stainless steel blade 10 is coated with a 30-200 nm thick homogeneous layer 16 of chromium and carbon in graphite form. The homogeneous layer 16 is coated with PTFE layer 17.

On FIG. 5, a stainless steel blade 10 is coated with a 20-30 nm thick chromium interlayer 18. Chromium carbon layer 16 comprises a first portion 16a of homogeneous carbon and chromium. In 10 nm thick second portion 16b, chromium content increases up to the interface with PTFE layer 17.

Of course, embodiments of the present invention are not limited to using only two components.

Instead of DC voltage, pulsed DC bias consisting of a DC continuous component and a pulse component superimposed on the DC continuous component, at a frequency of about 50-250 kHz, could be applied on the razor blades.

Two detailed process examples are given below.

Example 1

After loading the blade bayonets on the rotating 25 carousel, the chamber is evacuated up to a base pressure of $10^{-5}$ Torr. Then Ar gas is inserted into the chamber for a sputter etching step. Rotation of the blade bayonets begins at a constant speed of 11 rpm and the two Cr targets are operated under DC current control and DC voltage is applied on the stainless steel blades for 4 minutes.

After the end of sputter etching step the chamber pressure is adjusted to 3 mTorr. The Cr targets 1 and 3 are operated under DC current control at 1.5 Amps while a DC volt age of 300 V is applied on the rotating blades. Adjusting the deposition time a Cr layer of 20 nm is deposited on the edge of the blade samples.

After the deposition of the Cr layer, C targets 2 and 4 are switched on. The two C targets (2 and 4) and the two Cr targets (1 and 3) operate simultaneously, with the current on the Cr targets being 1.2 Amps and the current on each C target being 6 Amps. A DC voltage of 450 V is applied on the rotating blades. Adjusting the deposition time a Cr—C homogeneous alloy film of 50 nm is deposited on the Cr layer. On top of the Cr—C layer a fluoropolymer final layer (PTFE) of 500 nm is deposited, mainly to provide a lower friction of the blade surface.

Compositional analysis on stainless steel coupons of identical composition and heat treatment to the stainless steel blades, placed at the same deposition batch, yielded a composition of 70 at % C and 30 at % Cr for the Cr—C layer.

Stainless steel coupons with a total film thickness (Cr layer+Cr—C layer) of 100 nm deposited as described above, were also used for nanoindentation measurements using an XP Nano Indenter. Measurements on coupons simulating the final condition of the blade, resulted in increased hardness of the blade-coating system by a percentage of 30-50% as compared with classical Cr—Pt coated coupons of the same coating thickness, deposited from an alloy Cr—Pt sputtering target.

Results of tests used for investigation of blade cutting performance and strength, showed an improvement for blades coated with the new Cr—C film as compared with standard Cr—Pt coated blades. In a series of trials, a specific test involving the repeating cutting action of the blade on a moving felt using a load cell for measuring the load on the blade for each cut, resulted in load ranges for the first 10 cuts that were at least 5% lower than the load range of sister blades with standard production Cr—Pt coating. This result shows that the blades with the new Cr—C coating preserve their cutting ability (i.e. shape and integrity) in a more effective manner during cutting action (see Table 1).

The damage imposed on the blade edge after 10 cuts during the above-described test was also evaluated with the aid of an optical microscope. The damage on the blade edge was quantified in terms of area of missing material (i.e. material that has been broken and removed from the edge). Cr—C coated blades resulted in an 85% decrease of the missing material area as compared with blades with standard production Cr—Pt coating. This result shows the increased durability of the blades with the new Cr—C coating (see Table 1).

TABLE 1

Test results for first example blades

| Sample | Force at 10th cut (Kg) | Area of Damages (um2) |
|---|---|---|
| Blade with standard production coating | 1.761 | 33288 |
| Blade sample 1 | 1.455 | 4985 |
| Blade sample 2 | 1.464 | 3739 |
| Blade sample 3 | 1.455 | 3290 |
| Blade sample 4 | 1.508 | 3390 |
| Blade sample 5 | 1.45 | 1741 |
| Blade sample 6 | 1.447 | 1263 |
| Blade sample 7 | 1.435 | 1538 |
| Blade sample 8 | 1.372 | 1280 |
| Blade sample 9 | 1.345 | 1348 |
| Blade-sample 10 | 1.326 | 1879 |

Shaving tests in a panel experienced in shaving performance evaluation has shown that shavers comprising the new blades have performed better than current production shavers in comfort, closeness, irritation, number of nicks/cuts and overall opinion.

Example 2

After loading the blade bayonets on the rotating carousel, the chamber is evacuated up to a base pressure 10 of $10^{-5}$ Torr. Then Ar gas is inserted for a sputter etching step. Rotation of the blade bayonets begins at a constant speed of 11 rpm and the two Cr targets are operated under DC current control while DC voltage is applied on the stainless steel blades for 4 minutes.

After the end of sputter etching step the chamber pressure is adjusted to 3 mTorr. The Cr targets 1 and 3 are operated under DC current control at 1.5 Amps while a DC voltage of 300 V is applied on the rotating blades. Adjusting the deposition time a Cr layer of 20 nm is deposited on the edge of the blade samples.

After the deposition of the Cr layer, C targets 2 and 4 are switched on. The two C targets (2 and 4) and the two Cr targets (1 and 3) operate simultaneously, with the current on the Cr targets being 2.85 Amps and the current on each C target being 1.5 Amps. A DC voltage of 450 V is applied on the rotating blades. Adjusting the deposition time a Cr—C homogeneous alloy film of 60 nm is deposited on the Cr layer. On top of the Cr—C layer a fluoropolymer final layer (PTFE) of 500 nm is deposited, mainly to provide a lower friction of the blade surface.

Compositional analysis on stainless steel coupons of identical composition and heat treatment to the stainless steel blades, placed at the same deposition batch, yielded a composition of 17 at % C and 83 at % Cr for the Cr—C layer.

Stainless steel coupons with a total film thickness (Cr layer+Cr—C layer) of 100 nm deposited as described above, were also used for nanoindentation measurements using an XP Nano Indenter. Measurements on coupons simulating the final condition of the blade, resulted in increased hardness of the blade-coating system by a percentage of 30-60% as compared with classical Cr—Pt coated coupons of the same coating thickness.

Results of tests used for investigation of blade cutting performance and strength, showed an improvement for blades coated with the new Cr—C film as compared with standard production Cr—Pt coated blades. In a series of trials, a specific test involving the repeating cutting action of the blade on a moving felt using a load cell for measuring the load on the blade for each cut, resulted in load ranges for the first 10 cuts that were at least 10% lower than the load range of blades with standard production Cr—Pt coating. This result shows that the blades with the new Cr—C coating preserve their cutting ability (i.e. shape and integrity) in a more effective manner during cutting action (see Table 2).

TABLE 2

Test results for second example blades

| Sample | Force at 10th cut (Kg) | Area of Damages (um2) |
|---|---|---|
| Blade with standard production coating | 1.635 | 31258 |
| Blade sample 1 | 1.296 | 1857 |
| Blade sample 2 | 1.404 | 2014 |
| Blade sample 3 | 1.421 | 1664 |
| Blade sample 4 | 1.4 | 1438 |
| Blade sample 5 | 1.41 | 1127 |
| Blade sample 6 | 1.391 | 1121 |
| Blade sample 7 | 1.325 | 2299 |
| Blade sample 8 | 1.381 | 1356 |
| Blade sample 9 | 1.353 | 2486 |
| Blade sample 10 | 1.356 | 1569 |

The damage imposed on the blade edge after 10 cuts during the above-described test was also evaluated with the aid of an optical microscope. The damage on the blade edge was quantified in terms of area of missing material (i.e. material that has been broken and removed from the edge). Cr—C coated blades resulted in a 90% decrease of the missing material area as compared with blades with standard production Cr—Pt coating. This result shows the increased durability of the blades with the new Cr—C coating (see Table 2).

Shaving tests in a panel experienced in shaving performance evaluation has shown that shavers comprising the new blades have performed better than current production shavers in comfort, closeness, irritation, number of nicks/cuts and overall opinion.

The invention claimed is:

1. A method for depositing a coating on a razor blade edge of a razor blade,
    the razor blade edge having two sides converging towards a tip;
    the coating comprising an inner layer and an outer layer,
    the inner layer comprising at least a first component and a second component, including chromium and carbon, and being 30-200 nm thick;
    an enclosure comprising at least first and second sputter targets, the first sputter target including mainly the first component to be deposited on the razor blade edge and being adapted, in operation, to release the first component in the enclosure, the second sputter target including mainly the second component to be deposited on the razor blade edge and being adapted, in operation, to release the second component in the enclosure;
    the method comprising a moving step (a) wherein, under operation of both targets, the razor blade is moved relative to the at least first and second sputter targets to pass alternately in the vicinity of each sputter target, with the razor blade edge disposed toward the sputter target during the moving step, and
    further comprising an application step (d) wherein an outer layer comprising an organic material including PTFE is applied.

2. The method according to claim 1, wherein the first and second sputter targets are operated by bombardment of noble gas ions.

3. The method according to claim 1, wherein, during step (a), a magnetic field is generated by magnet devices in the vicinity of the targets.

4. The method according to claim 3, wherein the magnet devices each include at least a central magnet disposed between two side magnets and with opposed polarity, the side magnets being stronger than the central magnet.

5. The method according to claim 1, wherein the enclosure comprises first, second, third and fourth sputter targets, the first and third sputter targets facing each other and carrying the first component, the second and fourth sputter targets facing each other and carrying the second component, each of the first, second, third and fourth targets having a magnet device, the magnet devices of the second, third and fourth sputter targets being of same polarity.

6. The method according to claim 5, wherein the first, second, third and fourth targets are fixed in the enclosure, and wherein the razor blade is rotated relative to the enclosure so that it passes alternately in front of each of the first, second, third and fourth targets.

7. The method according to claim 6, wherein the blade is rotated at a rotation speed over 4 rpm.

8. The method according to claim 5, wherein the second component is chromium, wherein the second and fourth targets are operated by a DC current with an intensity comprised between 0.5 and 20 A.

9. The method according to claim 5, wherein the first component is carbon, wherein the first and third targets comprise graphite, and wherein the first and third targets are operated by a DC current with an intensity comprised between about 0.5 and about 20 A.

10. The method according to claim 5, wherein the chromium provides improved adherence to an organic material, and wherein, during step (a), a ratio of the current applied on the first and second targets decreases.

11. The method according to claim 1, wherein the blade is submitted to a DC voltage comprised between 100 and 2000 V.

12. The method according to claim 11, wherein the blade is submitted to a pulsed DC voltage.

13. The method according to claim 1, wherein, prior to step (a), razor blades are stacked in a carousel.

14. The method according to claim 1, further comprising a sputter-etching step (b) wherein material is removed from the blade by simultaneously operating the second target and applying a DC voltage on the blade.

15. The method according to claim 14, wherein step (b) is performed before step (a).

16. The method according to claim 14, further comprising a step (c) wherein at least an additional layer comprising at least one of the components is deposited by operating only the targets comprising the components of the additional layer.

17. The method according to claim 16, wherein step (c) is performed before step (a).

18. The method according to claim 16, wherein step (a) is performed before step (c).

19. A method for depositing a coating on a razor blade edge of a razor blade,
the razor blade edge having two sides converging towards a tip;
the coating comprising an inner layer and an outer layer,
the inner layer comprising at least a first component and a second component including chromium and carbon, and being 30-200 nm thick; an enclosure comprising at least first and second sputter targets, the first sputter target including mainly the first component to be deposited on the razor blade edge and being adapted, in operation, to release the first component in the enclosure, the second sputter target including mainly the second component to be deposited on the razor blade edge and being adapted, in operation, to release the second component in the enclosure,
the method comprising a moving step (a) wherein, under operation of both targets, the razor blade is moved relative to the at least first and second sputter targets to pass alternately in the vicinity of each sputter target, with the razor blade edge disposed toward the sputter target during the moving step;
a sputter-etching step (b) wherein material is removed from the blade by simultaneously operating the second sputter target and applying a DC voltage on the blade;
a depositing step (c) wherein at least an additional layer comprising at least one of the components is deposited by operating only the sputter targets comprising the components of the additional layer; and
an application step (d) wherein an outer layer comprising an organic material including PTFE is applied.

20. The method according to claim 1, wherein the razor blade is made of ceramic or stainless steel.

21. The method according to claim 7, wherein the razor blade is rotated between 4 and 40 rpm.

22. The method according to claim 1, wherein the inner layer comprises at least 30 atomic % chromium.

23. The method according to claim 22, wherein the inner layer comprises at least 83 atomic % chromium.

* * * * *